(12) United States Patent
Ostmeier

(10) Patent No.: US 7,271,357 B2
(45) Date of Patent: Sep. 18, 2007

(54) INTERFACE TEST SYSTEM

(76) Inventor: Hubert Ostmeier, Rodderbergstrasse, Bonn (DE) 53179

( * ) Notice: Subject to any disclaimer, the term of this patent is extended or adjusted under 35 U.S.C. 154(b) by 136 days.

(21) Appl. No.: 11/121,783

(22) Filed: May 4, 2005

(65) Prior Publication Data
US 2005/0250376 A1 Nov. 10, 2005

Related U.S. Application Data

(60) Provisional application No. 60/567,958, filed on May 4, 2004.

(51) Int. Cl.
*H01R 33/96* (2006.01)
(52) U.S. Cl. .................... 200/51.09; 439/188
(58) Field of Classification Search ............ 200/50.31, 200/51 R, 51.05, 51.07, 51.08, 51.09, 51.1, 200/51.11, 51.12, 51.13; 439/59–62, 55, 439/135, 188
See application file for complete search history.

(56) References Cited

U.S. PATENT DOCUMENTS

| 5,071,362 | A | * | 12/1991 | Martens et al. ............. 439/188 |
| 5,533,907 | A | * | 7/1996 | Kozel et al. ................ 439/188 |
| 5,601,442 | A | * | 2/1997 | Harting et al. .............. 439/188 |
| 5,788,520 | A | * | 8/1998 | Roche ........................ 439/188 |
| 5,899,764 | A | * | 5/1999 | Harting et al. .............. 439/188 |
| 6,099,333 | A | * | 8/2000 | Daoud et al. ................ 439/188 |
| 6,257,910 | B1 | * | 7/2001 | Mramor ...................... 439/188 |
| 6,609,920 | B2 | * | 8/2003 | Koyasu ....................... 439/188 |
| 6,796,803 | B2 | * | 9/2004 | Abe ............................. 439/62 |
| 6,888,078 | B2 | * | 5/2005 | Loeffelholz et al. ..... 200/51.09 |

FOREIGN PATENT DOCUMENTS

| DE | 17 98 757 | 10/1959 |
| DE | 102 16 913 A1 | 5/2003 |
| DE | 10 2005 025 108.0 B3 | 7/2006 |
| EP | 0 386 742 A1 | 9/1990 |

* cited by examiner

*Primary Examiner*—Michael A Friedhofer
(74) *Attorney, Agent, or Firm*—Troutman Sanders LLP; Ryan A. Schneider; James Hunt Yancey, Jr.

(57) ABSTRACT

High to medium voltage interface test systems and methods of testing high to medium voltage systems are provided. A high to medium voltage interface test device for testing a circuit connected comprises a block having a first aperture and a plug having a finger to insert into the first aperture. The finger can have insulation disposed between pins to isolate the pins, maintain correct polarity for the circuit, and open and connect to a circuit substantially simultaneously. An interface testing method for testing a high to medium voltage circuit can comprise inserting a finger of a test module into a first aperture of a block module, opening the circuit with the finger, and connecting the finger to the circuit. The opening and connecting to the circuit occur substantially simultaneously to achieve a make-before-break sequence.

20 Claims, 17 Drawing Sheets

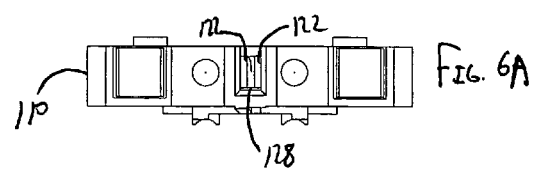
FIG. 6A
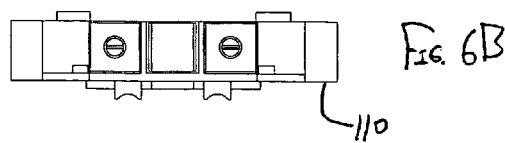
FIG. 6B
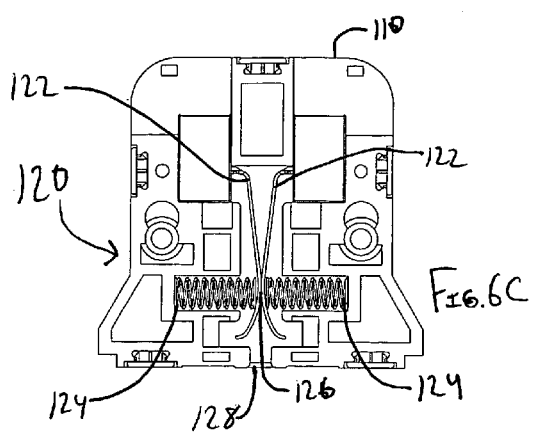
FIG. 6C
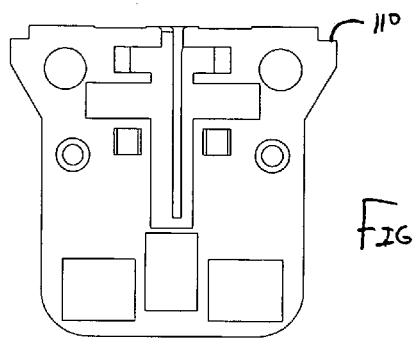
FIG. 6D
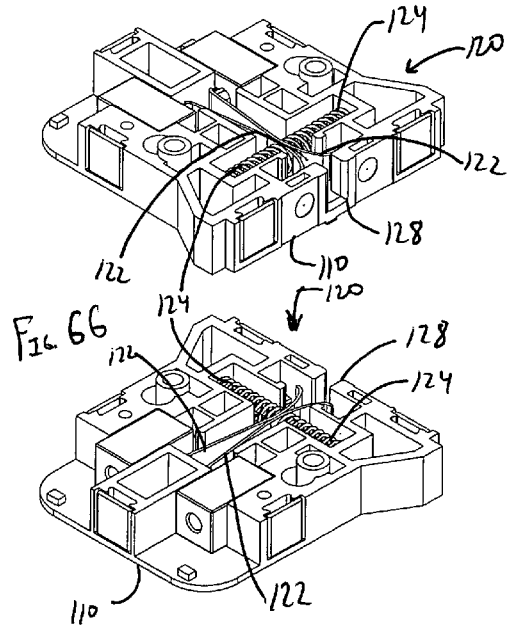
FIG. 6E
FIG. 6G
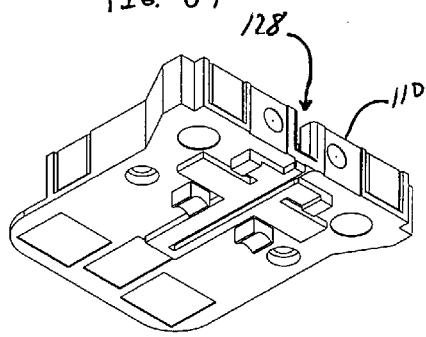
FIG. 6F
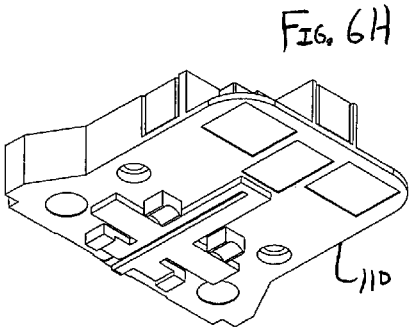
FIG. 6H

| | Description | I | X = | Is | Qty. | Ft. | Ohm/Ft | Electromagnetic Relay | | | Digital Relay | | | Vs |
|---|---|---|---|---|---|---|---|---|---|---|---|---|---|---|
| | | | | | | | | Ohm | Ohm | Ohm | Ohm | Ohm | Ohm | |
| Rs | CT Winding Resistance | | | | | | | 0.610 | 0.610 | 0.610 | 0.610 | 0.610 | 0.610 | |
| R1 | Conductor | | | | 2 | 850 | 0.0010 | 1.700 | 1.700 | 1.700 | 1.700 | 1.700 | 1.700 | |
| R2 | Relay Burden | | | | | | | 0.056 | 0.056 | 0.056 | 0.000 | 0.000 | 0.000 | |
| R3 | Terminations | | | | | | | 0.019 | 0.019 | 0.019 | 0.019 | 0.019 | 0.019 | |
| | Rs+R1+R2+R3 | | | | | | | 2.385 | 2.385 | 2.385 | 2.329 | 2.329 | 2.329 | |
| R4 | Test Plug | | | | | | | | | | | | | |
| | ABB | | | | | | | 0.384 | | | 0.384 | | | |
| | ALSTOM | | | | | | | | 0.010 | | | 0.010 | | |
| | SECUCONTROL | | | | | | | | | 0.015 | | | 0.015 | |
| | Rs+R1+R2+R3+R4 | | | | | | | | | | | | | |
| | ABB | 5 | 20 | 100 | | | | 2.769 | | | | | | 277 |
| | ALSTOM | 5 | 20 | 100 | | | | | 2.395 | | | | | 240 |
| | SECUCONTROL | 5 | 20 | 100 | | | | | | 2.400 | | | | 240 |
| | ABB | 5 | 20 | 100 | | | | | | | 2.713 | | | 271 |
| | ALSTOM | 5 | 20 | 100 | | | | | | | | 2.329 | | 233 |
| | SECUCONTROL | 5 | 20 | 100 | | | | | | | | | 2.329 | 233 |

FIG. 16

INTERFACE TEST SYSTEM

BENEFITS CLAIM

This application claims the benefit of Provisional Application No. 60/567,958, filed 4 May 2004.

BACKGROUND OF THE INVENTION

1. Field of the Invention

The present invention relates generally to an interface test system, and relates more specifically to a test block and test plug for relay and meter testing.

2. Description of Related Art

Test blocks, test plugs, test probes, and related devices are most often found in direct association with current transformers, potential transformers, metering apparatus, and protective relay systems. The supply of electricity must be continuous and uninterrupted by breakdown. In the early days of electricity, spectacular failures were commonplace. Accurate revenue metering devices, protective relays, and circuit interrupting devices were thus developed. These devices typically were complex electromechanical assemblies. Mechanical parts needed to be lubricated, adjusted, and aligned. Electrical parts eroded, burned, and failed in use. The electrical testing and maintenance industry is born.

Alternating current becomes dominant with electric power conductors carrying larger and larger currents. Known metering and relay devices were no longer able to accommodate these currents directly. For high current, AC, power circuits, the current transformer was developed and used to provide a proportional, accurate current interface. Meter and relay current input standardization followed. However, the current transformer solution is limited. The secondary current loop must not be switched opened or disconnected when the primary side, power circuit is energized. In such a configuration, the current transformer fails catastrophically as a result of over-excitation, magnetic core saturation, over temperature, core interleaf, and winding insulation breakdown.

It is probably that in response to the disadvantages of the current transformer, the test block was designed. A first early example is shown in FIG. 1, and is a control rod, being a General Electric test block device. The operator's current meter was made active when the control rod was inserted into the board-mounted receptacle. Insertion of the rod separated the two parts of a switch. The switch was connected across the current transformer secondary terminals and in parallel with the current meter terminals. With the rod removed, the switch is closed; current flow is from the transformer through the switch and back to the transformer completing the secondary loop. In this condition, the current meter could then be safely removed for calibration. The control rod is made from an insulating material. The rod is fitted with a brass tip that provides a make before break switch action.

Developed in the 1930s, the General Electric, Type PK-2 test block (with keyed cover) is the genesis of all testing devices. Generally, the PK-2 was cased in a Bakelite casing housing ten contacts that are closed when a matching plug is inserted. Thus, the plug must be inserted at all times and will only be removed when opening the circuits. Short circuits are achieved inside the test block, but this time by removal of an item. This system has been rendered unsafe for the use in nuclear power stations since the 1970s but has been in use in various places up to today nevertheless.

The example shown in FIG. 2 is a device including eight terminals configured as four, entry side and four, exit side. The connected instrument, relay or meter, is made active when the cover plug is inserted into the block. Four copper conductor bridges internal to the cover complete the connection between entry and exit. When the cover is removed, a shunt in the block side is switched across two of the entry side terminals that would be used for the current transformer secondary. With the cover removed, the associated relay or meter is isolated and could be disconnected for service or replacement.

As the test block evolved, the Westinghouse Type FT (Flexitest) was developed, and was a test block with an insulated, draw-out style, protective relay case. Such a device is described in a Westinghouse Instruction Manual, I.L.41-076D, effective February 1965. The test block at the lower edge of the case contains two color, coded "knife-blade test switches." Westinghouse recommends: "Always open the red handle switches first before any of the black handle switches . . . " The individual knife-blade test switches provide the test technician with individual switching control of each external connection. The reference to the red handles is a recommendation to open the trip circuits first to prevent an accidental trip out of the circuit breaker. Some of the knife-blade switches are configured for current transformer connection. When opened, the current transformer configured knife-blade switch causes the engagement of a shorting jaw across the current transformer secondary (while isolating the relay current input for test purposes.) Opening all test switches isolates the relay. Next a multi-circuit test plug is inserted that permits external connection to the relay for relay testing "in case." Or, alternately the relay can be removed from the case for replacement or testing "out of case." The Type FT (Flexitest) case with accessory test plugs and probes, provides three relay test modes described by the instructions as follows: Testing in Service, Testing In Case, and Testing Out of Case.

The test block is still currently in use today. The device continues to evolve and adapt. Digital relays have not eliminated the need for the test block (as predicted by some). In response to industry needs, test block development and innovation continues to drive new products to the market.

Although test block systems are known, FT switches represent the most common comparative usage prevalent in the US. They are manufactured in various sizes by various manufacturers—the most prominent being ABB. The FT switch includes two stainless steel parts, one of which is equipped with an angled connector that can be pressed into a fitting indenture of the other part, thus making connection. To open the circuit, the angling part has to be removed out of the indenture manually. For this usage, the angling part is equipped with a plastic cover. Theoretically, FT switches are also modular in usage, but they are usually housed in a plastic casing and come in groups of ten. ABB provides test handles for ten contacts, which can be inserted after all ten contacts have been opened individually. These test handles also provide stainless steel as conductive material.

FT switches incorporate disadvantages, including that the contacts have to be opened individually, the user needs to know the whole setup of the system; manual opening and closing makes way for human error that can be dangerous; manual opening puts the user at risk of electrical shock; the used material (stud-welded stainless steel) has high internal resistance of 200-300 Milliohms and reaches temperatures of more than 70 degrees Celsius; and all operations (elimination of CTs and PTs, qualified injection) have to be performed by highly trained professionals.

Test blocks, test plugs, and probes are available today with decidedly different functionality and technical characteristics. This range is best understood by the comparison of products offered by two manufacturers, ABB and AREVA, in view of the present invention.

Product development by each manufacturer reveals a concentration of test characteristics either in the block, or the plug. The test block is the electrical switching device that is permanently wired into the operating circuits, typically in the face or back panel of a substation cabinet, or 19-inch rack. A focus on the test block is found in the ABB products (Westinghouse legacy) and in the AREVA products. A disadvantage of the block focus is that it places the test characteristics (higher cost and complexity) in the device installed in the substation panel.

An example of one ABB test block product is the ABB FT-1 Switch, which is constructed with a one-piece, molded polycarbonate base unit that can be configured with between 1 and 10 switch poles. Three FT-1 Switch units can be grouped together in the FT-19R, 19-inch rack assembly (30 poles). In the FT-1, individual switch poles are generally either potential poles or current poles. Potential poles are non-shorting knife blades (potential, trip, or control.) Current poles are configured in sets of two; the configuration includes a current test jack, a shorting spring, a shorting blade, and a non-shorting blade. Current pole handles are typically color coded black. Potential pole handles are typically red or black. Other handle color options include: green, yellow, blue, white, and orange. This ABB unit offers only manual operation.

ABB offers three test plug versions for use with the FT-1 Switch: (1) in-service series, (2) individual current circuit test plug, and (3) separate source test plug. The "in-service series" test plug, with up to ten poles, is used to make a connection between external test instruments and active currents and voltages (with the relay or other switchboard device in service.) The "individual current circuit test plug" is the current probe option that may be used to connect an external meter into an active current loop. The ABB knife blade switch must be in the open position to permit insertion of the current probe. The third plug option, "separate source test plug" is used to isolate and connect the "out of service" relay or switchboard device to external test instruments. The "separate source test plug" is inserted after all ten poles of the FT-1 Switch (test block) are open.

An example of one AREVA test block product is the AREVA P990 Test Block, which is designed to contain 14 cassettes. Each cassette contains a switch contact pair. The cassettes are available in five types: Stage I, Stage II, Stage III, CT, and Blank. The three stage cassettes provide the three steps of an automatic operating sequence. The CT cassette includes provision for shorting the current transformer loop. This AREVA unit offers an automatic operating sequence.

The AREVA P992 multi-finger test plug is used with the P990 test block to connect external test instruments to the relay (or other switchboard device.) The insertion of the P992 test plug opens circuits in a pre-configured sequence of up to three steps. The insertion of the plug safely shorts current transformer circuits. The AREVA P993 single-finger test plug is used to measure an individual current circuit.

The AREVA P992 and P993 probe finger design causes a momentary opposite polarity circuit connection during insertion and extraction. See FIG. 3. This momentary polarity reversal is a serious design flaw that may cause damage to any connected device with a grounded (earthed) power supply input terminal. Refer to the AREVA instructions for more information about this hazard.

Therefore, it can be seen that a need yet exists for a superior interface test system. It is to such a system that the present invention is primarily directed.

BRIEF SUMMARY OF INVENTION

Briefly described, in its preferred form, the present invention is an interface test system, that as distinguished from the prior art, emphasizes the test plug, as opposed to the test block. The system comprises a test block and a test plug, the test block preferably comprising a module, a first set of springs, a second set of springs, a connector block, a coded disc, and a stabilizing assembly, and the test plug preferably comprising a module, a set of pins, and a housing assembly.

Such test plug emphasis is preferable, as building the test characteristics in the test plug simplifies the block (lower cost and complexity) and allows the test characteristics to become portable. Further, the present invention provides an automatic operating sequence.

The present system incorporates modularity (allowing for custom-made solutions), finger safety, elimination of accidents in opening and closing, and optimal conductivity leading the way to present relays and meters.

In essence, two copper springs held together by pressure springs guarantee superior conductivity during normal operation. When the present test plug is inserted, circuits are automatically opened and redirected via the test plug. Beneficially, the test block is equipped for ring lugs, making the connection in the panel even safer. While today's relays and meters are becoming more sophisticated, the present invention provides the optimal material in auxiliary equipment called for. The present system comprises high quality conductive materials, including silver, copper, and brass, to protect the relay or meter from fault sources that lie in its periphery and have to be avoided.

Modular units of the system can be made to fit the same measurements as FT switches. For example, thirty contacts can easily fit a 19-inch rack, achieving the usual setup of 10-10-10. No new cutouts in the metalwork are necessary for a retrofit of the present system.

In a preferred embodiment of the present invention, an interface test device for testing a circuit can comprise a block module having a first aperture and a plug module having a finger insertable into the first aperture. The finger can be adapted to open and connect to a circuit substantially simultaneously. The finger can comprise isolated conductors to maintain correct polarity for the circuit upon insertion into the first aperture. The finger can be keyed to the first aperture to ensure proper insertion into the first aperture. Keying the finger and the first aperture provides a safe system by ensuring that a test module can only be inserted into a correct and corresponding block module. This aspect according to a preferred embodiment of the present invention can also be utilized for many other circuit interfaces. The plug module can comprise a second aperture to receive a test probe, and the second aperture can be coupled to at least a part of the finger.

The block module can comprise a pair of contacts to form a contact point to receive the finger. This configuration enables one contact to be coupled to one conductor of the plug module and the other contact to be coupled to the other conductor of the plug module. The block module can also comprise a pair of biasing members to bias the pair of contacts. Preferably, the contacts are contact springs and the biasing members are biasing springs. The block module also preferably has a resistance of approximately two milliohms to approximately three milliohms so that it does not interfere with the operational characteristics of a circuit connected to the block module.

In another preferred embodiment according to the present invention an interface test system can comprise a test plug and a test block. The test block can have a plurality of connection points and a first set of apertures corresponding to the connection points. The test plug can have a plurality of fingers insertable into the apertures to contact the connection points. Preferably, the fingers can substantially simultaneously open and connect to at least one circuit that is connected to the test block. The test block can also comprise a first set of springs to form the connection points, and a second set of springs to bias the first set of springs. The test block can also have a resistance of approximately two milliohms to approximately three milliohms.

The test plug can also include a leading pin and the test block can have a safety aperture to receive the leading pin. The leading pin and safety aperture can be utilized ensure that the correct test plug is being inserted into the correct test block. In addition, a pattern of short circuits, and short or long fingers (or pins) can be defined through the leading pins of the test plug. The leading pins can be adjusted to correspond with safety apertures (or disks) in the block to designate that test plug is to be used with a corresponding test block.

Preferably, the fingers of the system comprise a pair of conductors separated by an insulator to maintain correct polarity for at least one circuit upon inserting the at least one finger into one of the apertures. In addition, at least two of the fingers of the test plug can have different lengths to engage at least two of the connection points at different times. This configuration enables an automatic operating sequence to take place when inserting and removing the test plug from the test block. The test plugs of the present invention can also be coupled together with a shorting conductor such that two circuits are shorted. In addition, at least one of the fingers and at least one of the apertures can be keyed to ensure proper insertion between the at least finger and the at least one aperture. This keying feature of the present invention provides a safety measure, eliminates matching mistakes, assists in developing switch standards for relays, and provides a smooth and even connection between test blocks and test plugs.

In yet another preferred embodiment of the present invention, an interface testing method for a circuit comprises inserting a finger of a test module into a first aperture of a block module, and substantially simultaneously opening the circuit with the finger and connecting the finger with the circuit. This feature enables a "make-before-break" sequence that enables current to continuously flow through a test block while substantially simultaneously redirecting the current flow for a circuit connected to the test block. A method according to an embodiment of the present invention can also include providing a finger with a first conductor isolated from a second conductor, providing a contact point defined by a first and second contact spring, coupling the first conductor to the first contact spring, and coupling the second conductor to the second contact spring. A method of the present invention can further include connecting a second finger into a second circuit before connecting the first finger into the first circuit, and keying the finger to correspond with an aperture for receiving the finger.

More preferably, the present interface test system comprises a test block having modular switch contact pairs, and a test plug, being a multi-pole, electrical testing device that is inserted into the test block. The modular switch pairs of the test block can be assembled in any number, preferably in the range between two and twenty-one. It can include a 19-inch rack assembly, 30 poles (3 groups). Table 1 illustrates some of the main characteristics of the test block of present invention (noted as Secucontrol), as against the ABB and AREVA (noted as ALSTOM) offerings.

TABLE 1

| DESCRIPTION | ABB | ALSTOM | SECUCONTROL |
|---|---|---|---|
| TEST BLOCK | | | |
| SWITCHING | Knife Blade | Contact Pair (Cassettes) | Contact Pair |
| ASSEMBLY | Base | Housing | Modular |
| POLES, MIN | 1 | 1 | 1 |
| POLES, MAX | 10 | 14 | 21 |
| DIMENSIONS (APPROX.) | | | |
| DEPTH, INCH (MM) | 2 | 10 | 2 3/8 |
| (MM) | (51) | (240) | (60) |
| FACE, INCH | 2 7/8 × 6 3/8 | 2 × 7 | 2 3/16 × 5 1/16 |
| (MM) | (71 × 162) | (51 × 177) | 55 × 129 |
| SECURITY COVER OPTIONAL ASSEMBLY | Yes | Yes | Yes |
| 19 INCH RACK POLE ASSEMBLY | Yes 3 × 10 | N/A N/A | Yes 3 × 11, 2 × 14, 7 + 19 |

Table 2 illustrates some of the main characteristics of the test plug of present invention (noted as Secucontrol), as against the ABB and AREVA (noted as ALSTOM) offerings.

TABLE 2

| DESCRIPTION | ABB | ALSTOM | SECUCONTROL |
|---|---|---|---|
| TEST PLUG | | | |
| SWITCHING | No | Yes | Yes |
| ASSEMBLY | Fixed | Fixed | Modular |
| POLES, MIN | 10 | 14 | 1 |
| POLES, MAX | 10 | 14 | 21 |
| AUTO SEQUENCE | No | Yes | Yes |
| CURRENT PROBE | Yes | Yes | Yes |
| IN SERVICE | Yes | Yes | Yes |
| OUT OF SERVICE | Yes | Yes | Yes |

The present system is beneficial not only in its high variability, but also in its superior electrical abilities. Preferably, every test block module is the same, which accounts for its easy application in substation design and panel building. With the present system, the panel builder needs only to know the required number of contacts and the prospective keying system. The circuit designer has the freedom to prescribe the testing procedure, which will be mirrored by the keying system, the division of the plug in long and short pins, and the allocation of short circuits.

Similar relays will receive similar treatment, limiting the number of test plugs needed for testing procedures. At the same time, the test block of the present invention guarantees good electrical qualities for relays and meters that become ever more sophisticated. Digital technology has made it that relays react at the slightest faults, and no one can determine if these were not caused by auxiliary material of the relay rather than the network. The next generation of relays calls for more sophistication in handling their testing procedures, which is provided by the present system.

The present system is an improvement over the prior art in at least four areas, modularity, "make-before-break", short circuiting, and connectivity. Regarding modularity, the prior art systems are modular, but they are limited by the plastic casings, in which they are sets. For example, AREVA offers only varieties of 14 poles and ABB offers 7, 10, and 14 poles. The present invention is truly modular.

Further, the test block of these manufacturers has a complicated setup of bent metal contacts that need to be mirrored by the plug's pin. Thus, the pin consists of a plastic center and two stainless steel plates on each side. But strangely enough, one side of the pin is bent around the tip of the pin while the other side stops short at about 1 cm distance from the tip. So when the pin is inserted, for a while, only one side of the pin has contact to both sides of the block. Towards the end of the block the isolated gap of the pin slips over an isolated area inside the block before the contact is opened finally. This makes for a dangerous time span during insertion when the separation of the circuit is not defined.

When a pin of the present test plug is inserted into the test block, the two sides of the pin contact the respective sides of the copper springs first, before forcing an opening of the contact point. Thus, a "make-before-break" sequence is achieved.

Thus, while test blocks, test plugs, and probes are known, they have decidedly different functionality and technical characteristics. It is an object of the present invention to provide an interface test system with test plug emphasis, as opposed to test block. Products by ABB (Westinghouse legacy) and AREVA are designed with the test characteristics (higher cost and complexity) in the device installed in the substation panel.

It is another object to provide an interface test system that does not incorporate an opposite circuit connection. The AREVA P992 and P993 probe finger design causes a momentary opposite polarity circuit connection during insertion and extraction. The present system includes a contact pair and finger design that maintains correct polarity without compromise.

A further object of the present invention is to place engineered, test characteristics in the test plug. This design simplifies the test block (lower cost and complexity,) and allows the test characteristics to become portable, and upgradeable. The present system permits the test engineer to re-examine the problem and to, therefore, re-think the solution.

Yet another object of the present invention is to provide a system incorporating automatic operation (as opposed to manual), which avoids costly error. Pre-configured, standard pole designations reduce time during onsite testing.

An object of the present invention further includes providing a compliant system. In relay applications, test blocks, plugs, and probes must comply with the ANSI/IEEE Standard C37.90-1989, IEEE Standard for Relays and Relay Systems Associated with Electrical Power Apparatus, as does the present invention.

Additionally, an object of the present invention is to provide a protective relay application, wherein the burden placed on the current transformer is within acceptable limits. Test block circuit resistance impacts more than voltage drop and watt loss.

These and other objects, features and advantages of the present invention will become more apparent upon reading the following specification in conjunction with the accompanying drawing figures.

BRIEF DESCRIPTION OF THE DRAWINGS

FIGS. 6a-h (collectively FIG. 6) illustrate several views of a module of a test block in accordance with a preferred embodiment of the present invention.

FIG. 16 is a method for calculating an expected CT burden.

DETAILED DESCRIPTION OF PREFERRED EMBODIMENTS

Figure 1:
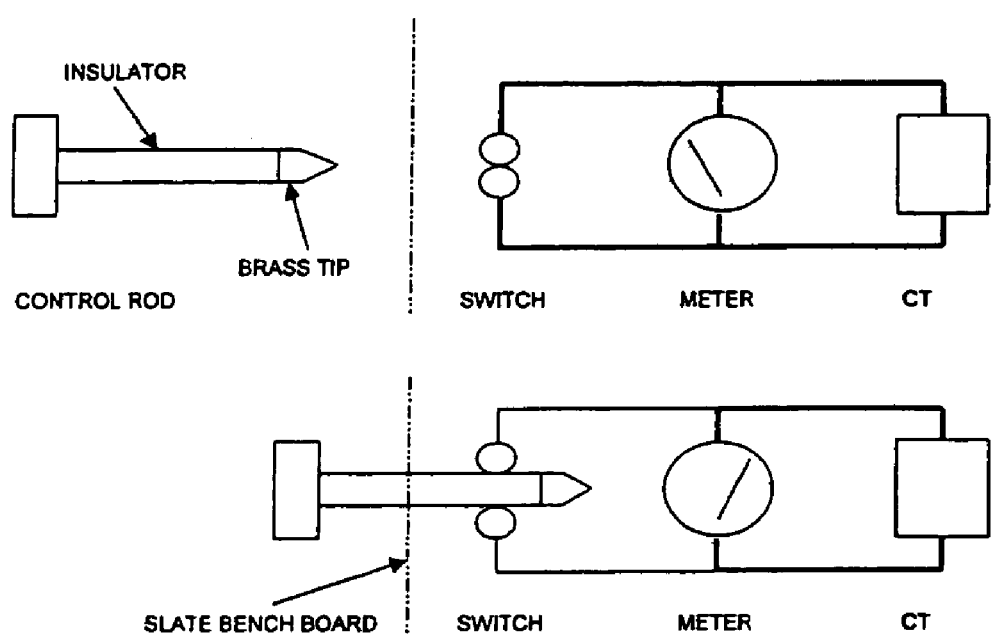
FIG. 1 is a prior art test block example.
Figure 2:
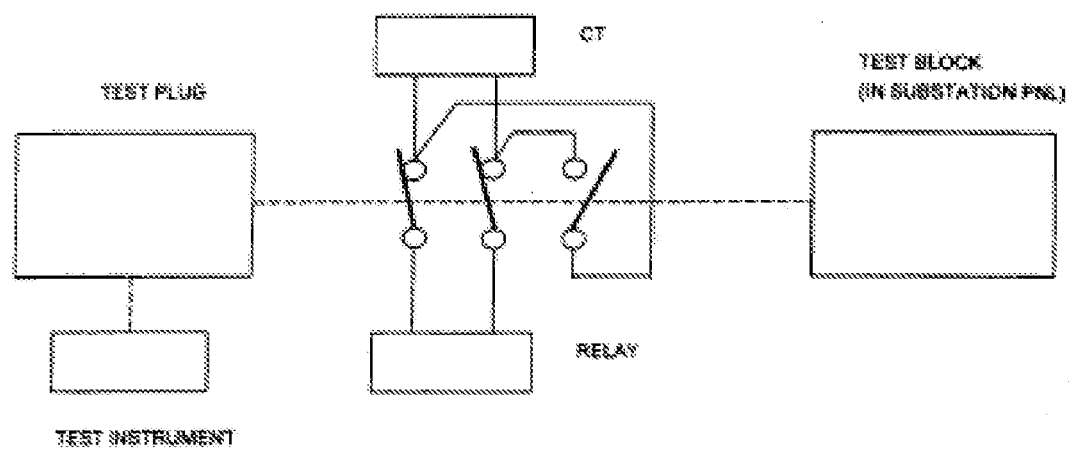
FIG. 2 is a second prior art test block example.
Figure 3:
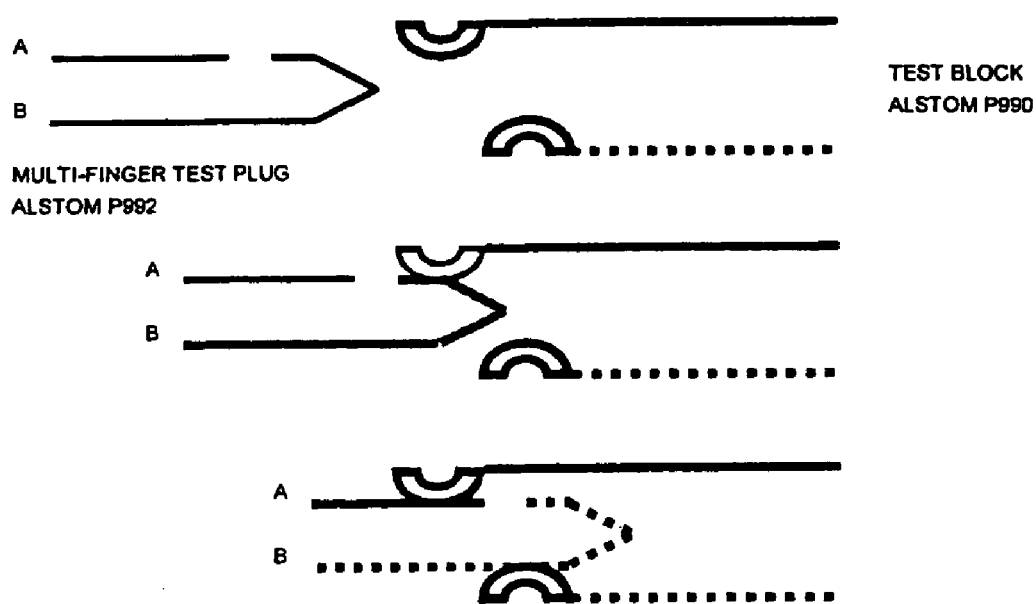
FIG. 3 is an illustration of a prior art probe finger design of the AREVA P992 and P993.

The present invention is an innovative approach to test switch technology. The invention provides safe access to control, protection, and automation devices in a secondary circuit. In accordance with a preferred embodiment, the present invention generally comprises a test block and a test plug for testing circuits connected to an electrical panel.

The test block assembly is preferably simple, facilitating entry into a circuit or the closure of a circuit. The test block assembly in accordance with a preferred embodiment of the present invention comprises a contact spring pair. The spring pair is preferably bent into a specified shape at its knee so that the spring pair contact forming a contact point. In addition, the bent shape of the spring pair provides extra strength to the spring pair and prevents the spring pair from breaking or becoming damages when being utilized.

The test block can be mounted in an electrical panel for long time periods, and since it only serves to interface with circuits, all future technical developments and future advancement in procedures can be housed in the test plug. Thus, the embodiments of the present invention provide an interface test system that is easily upgradeable or modified with a new or reconfigured test plug.

A preferred embodiment of the present invention utilizes various safety enhancing designs providing a safe working environment for users. For example, the test block and test plug can be keyed ensuring that only the correct test plug pin can be inserted into the correct test block. Several keying methods can be utilized in accordance with the embodiments of the present invention, including providing ridges in the test plug pins and associated test block receptors, and varying the gauges of the test plug pins and associated block receptors.

A preferred embodiment of the present invention utilizes a test plug having a unique test plug pin. A pin of the test plug module is made to open and connect to the circuit at substantially the same time. This function is unique compared to other hardware on the market. This function also enables the testing of a device while coupled to a system being tested. In other words, the present invention can enable a user to test a system while the system is operating thus providing better system data. In addition, the test plug provides an automatic operating sequence when installing and removing the test plug into a test block. For example, in a complex plug assembly, varying the length of the test plug pins enables an initialization time sequence when opening or closing circuits, thus enabling standard testing procedures for complex circuits. Still yet, the test plug modules forming the test plug block can be adapted to be short circuited utilizing shorting bars. This safety function eliminates dangerous circuits, for example current transformer circuits.

The embodiments of the present invention also provide true modular interface test systems. More specifically, the present invention provides an interface test system that is scaleable by adding or removing single modules of a test block and test plug. The modular assembly of the test blocks and test plugs gives the opportunity to combine measurement, testing, connection, and terminal functions in one block assembly. Indeed, a preferred embodiment of the present invention enables measurement, testing, connection, and terminal functions to be included in a single piece of hardware. Further, the modular assembly of test plugs can be adapted to correspond with a test block assembly comprised of multiple test block modules. The truly modular approach of the present invention enables panel space savings and harmonization, as well as allowing standardized operating procedures for testing procedures.

The embodiments of the present invention also provide an interface system capable of easily retrofitting existing systems. In particular, the variable system for labeling clips enables existing systems to be retrofitted for use with the embodiments of the present invention. Users do not have to change wiring plans and drawings when label indications on the test block assembly of the present invention can be changed or modified.

Figure 4A:
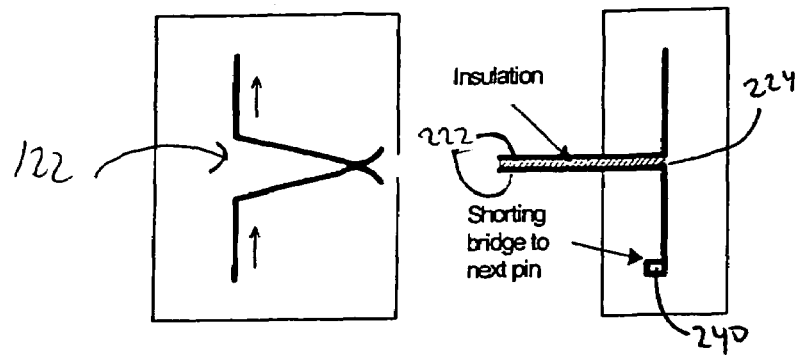
FIGS. 4a-c (collectively FIG. 4) illustrate the functional principle of the present invention in accordance with a preferred embodiment.
Figure 4B:
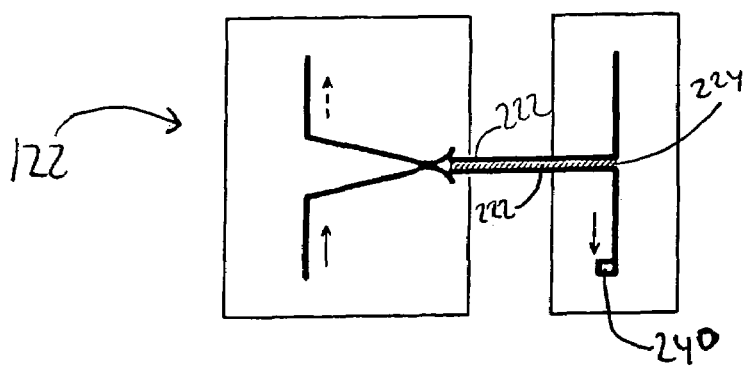
Figure 4C:
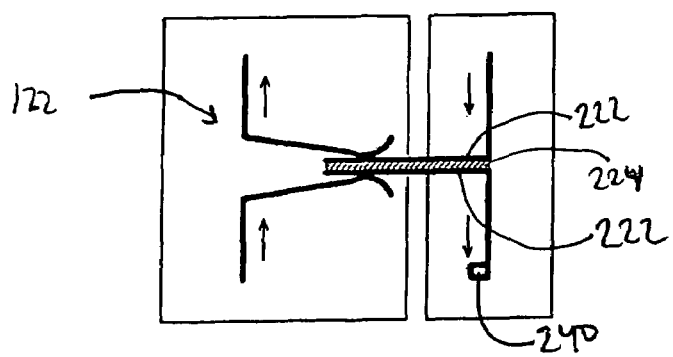
Figure 5A:
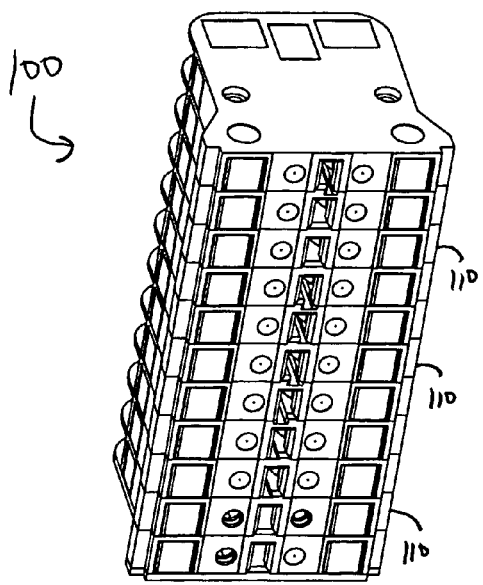
FIGS. 5a-d (collectively FIG. 5) illustrate a preferred embodiment of a test block of the present invention, in both perspective and face views of the front and back of the test block.
Figure 5B:
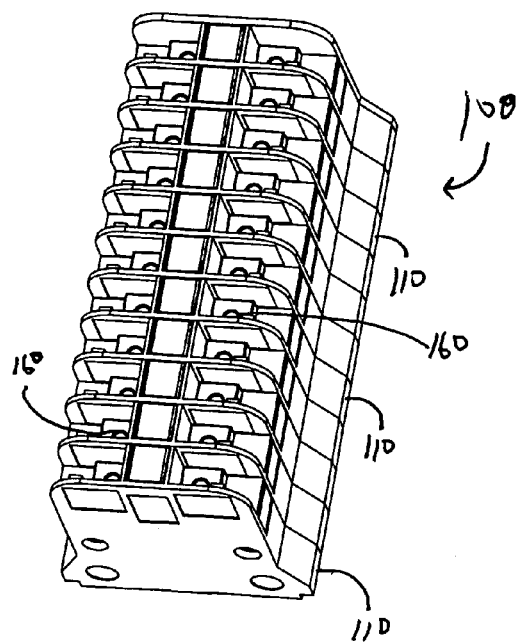
Figure 5C:
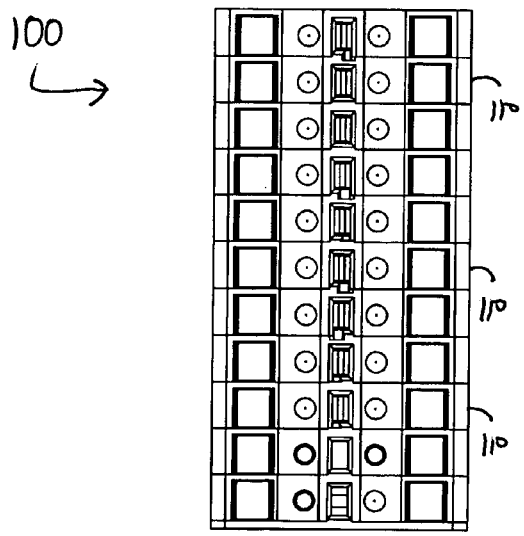
Figure 5D:
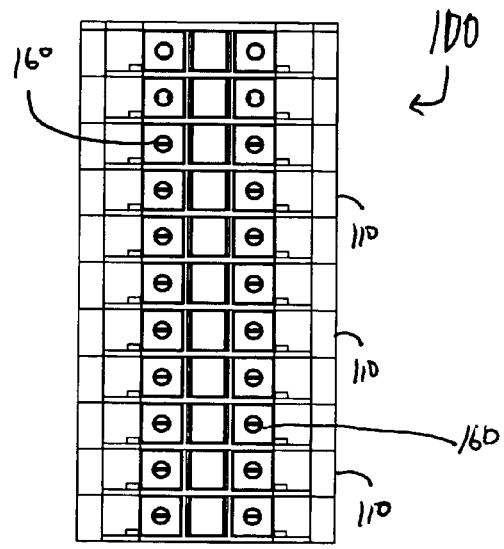
Figure 7A:
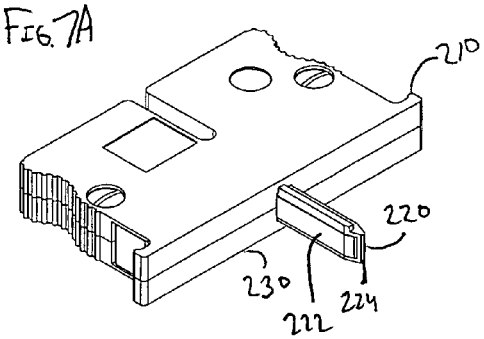
FIGS. 7a-f (collectively FIG. 7) illustrate several views of a module of a test plug in accordance with a preferred embodiment of the present invention.
Figure 7B:
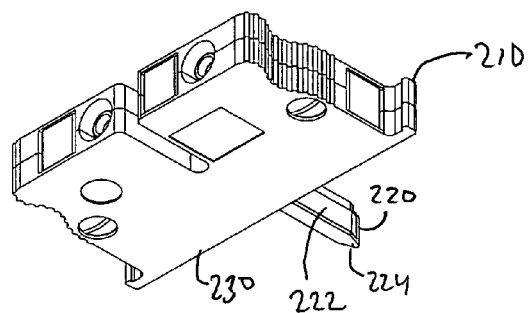
Figure 7C:
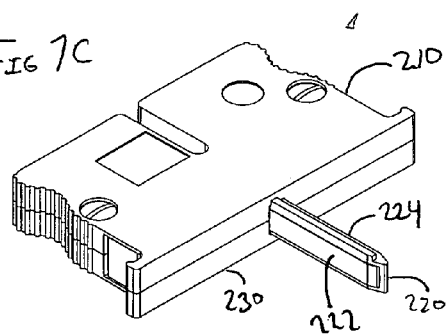
Figure 7D:
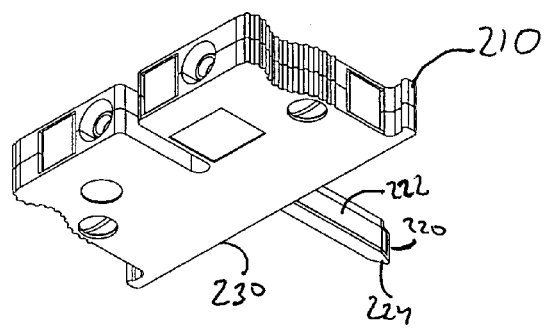
Figure 7E:
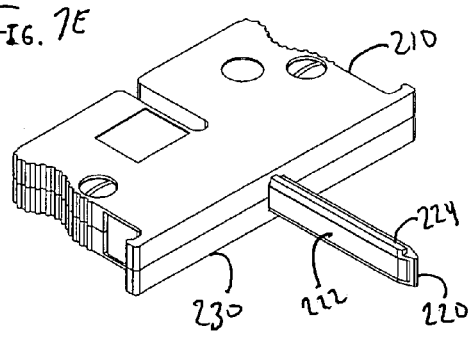
Figure 7F:
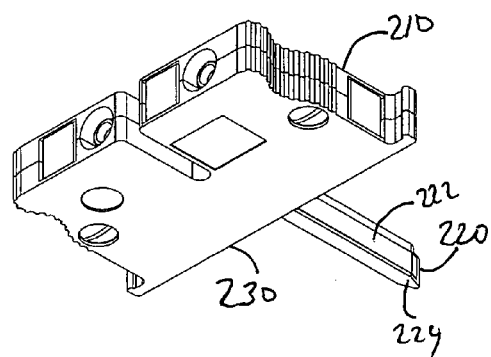
Figure 8A:
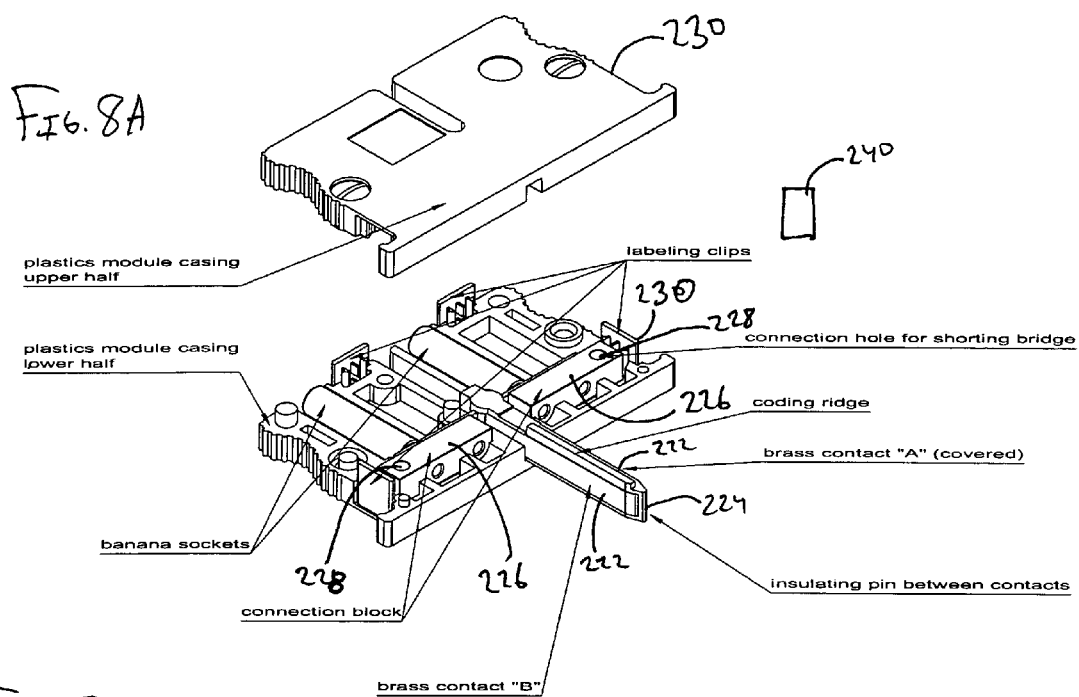
FIGS. 8a-d (collectively FIG. 8) illustrate several views of a module of a test plug in accordance with a preferred embodiment of the present invention.
Figure 8B:
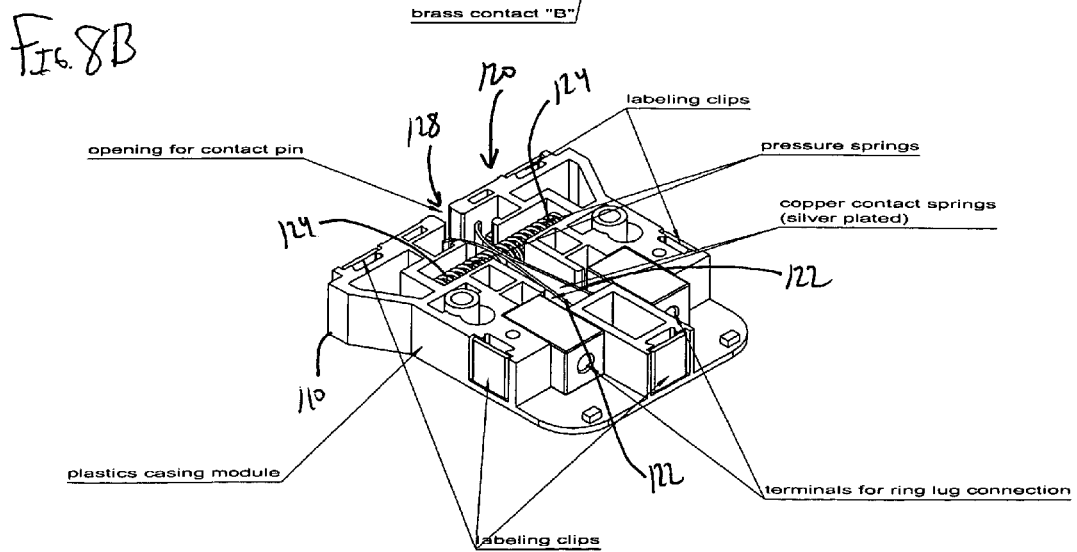
Figure 8C:
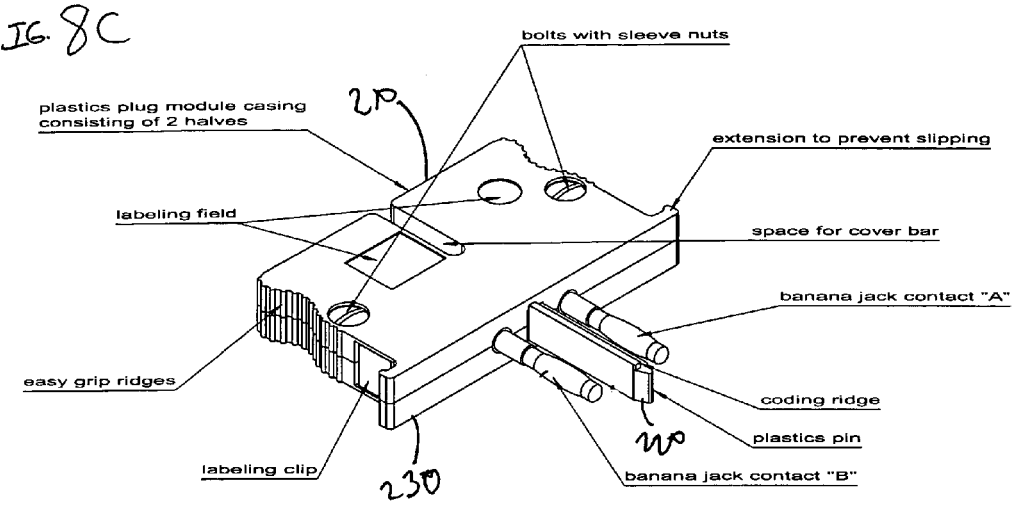
Figure 8D:
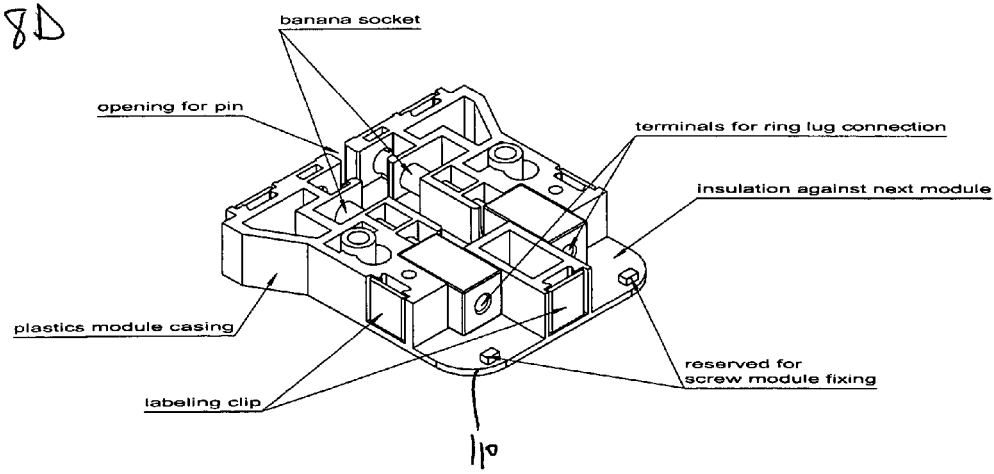
Figure 9:
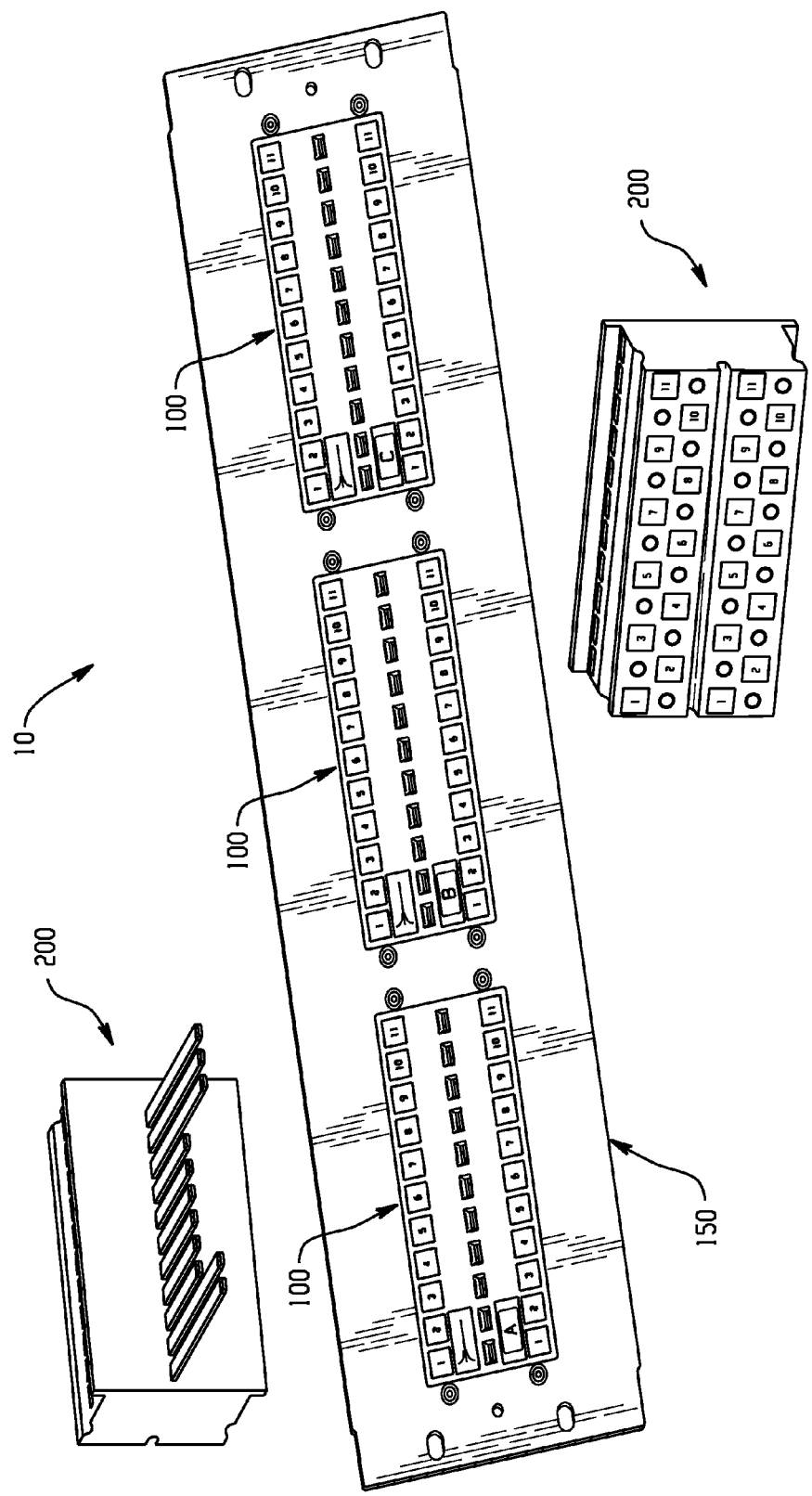
FIG. 9 illustrates a test block in accordance with one embodiment of the present invention comprising a 19-inch rack assembly, 30 poles (3 groups).
Figure 10:
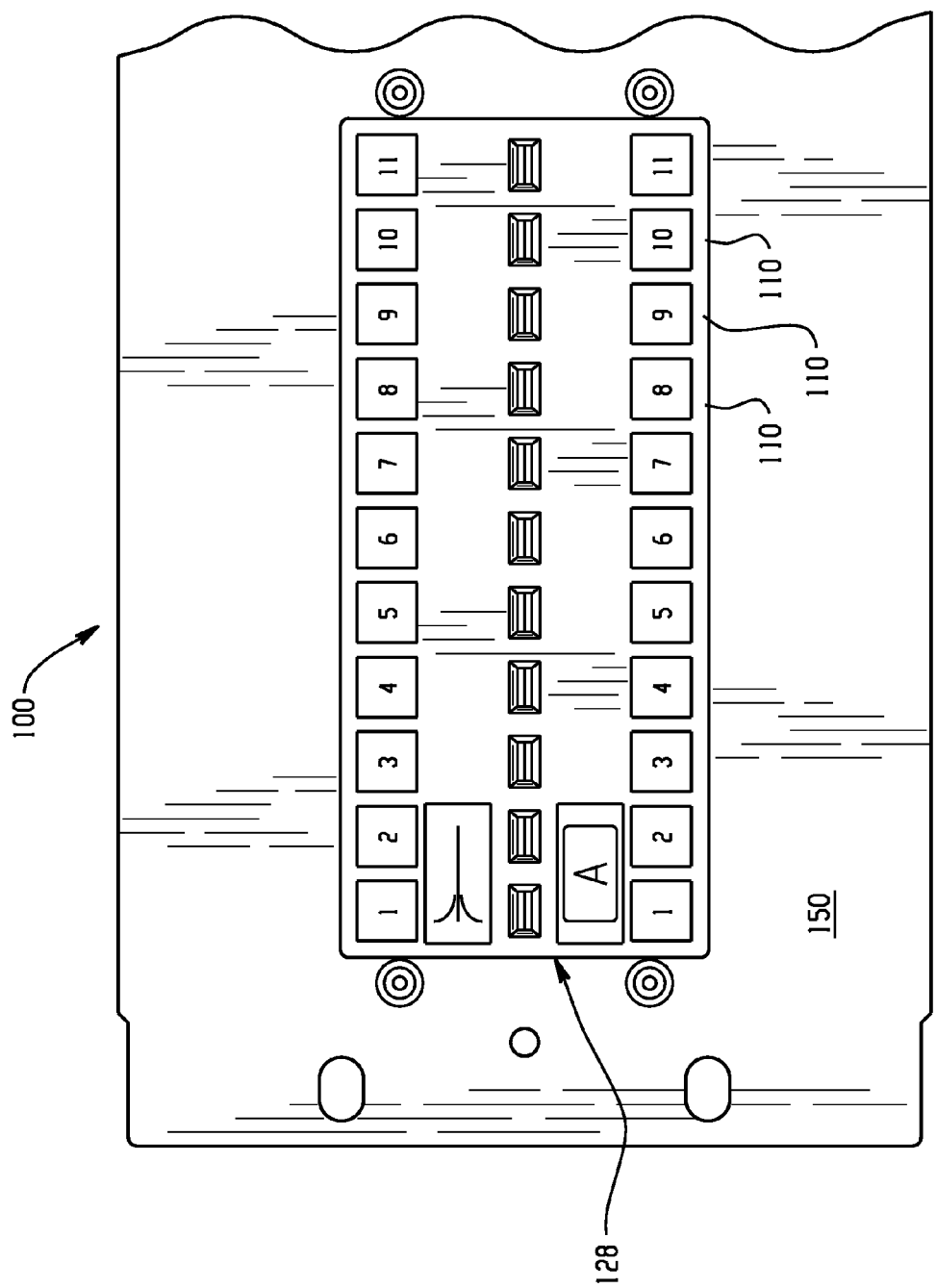
FIG. 10 is a close-up view of the test block illustrated in FIG. 9.
Figure 11:
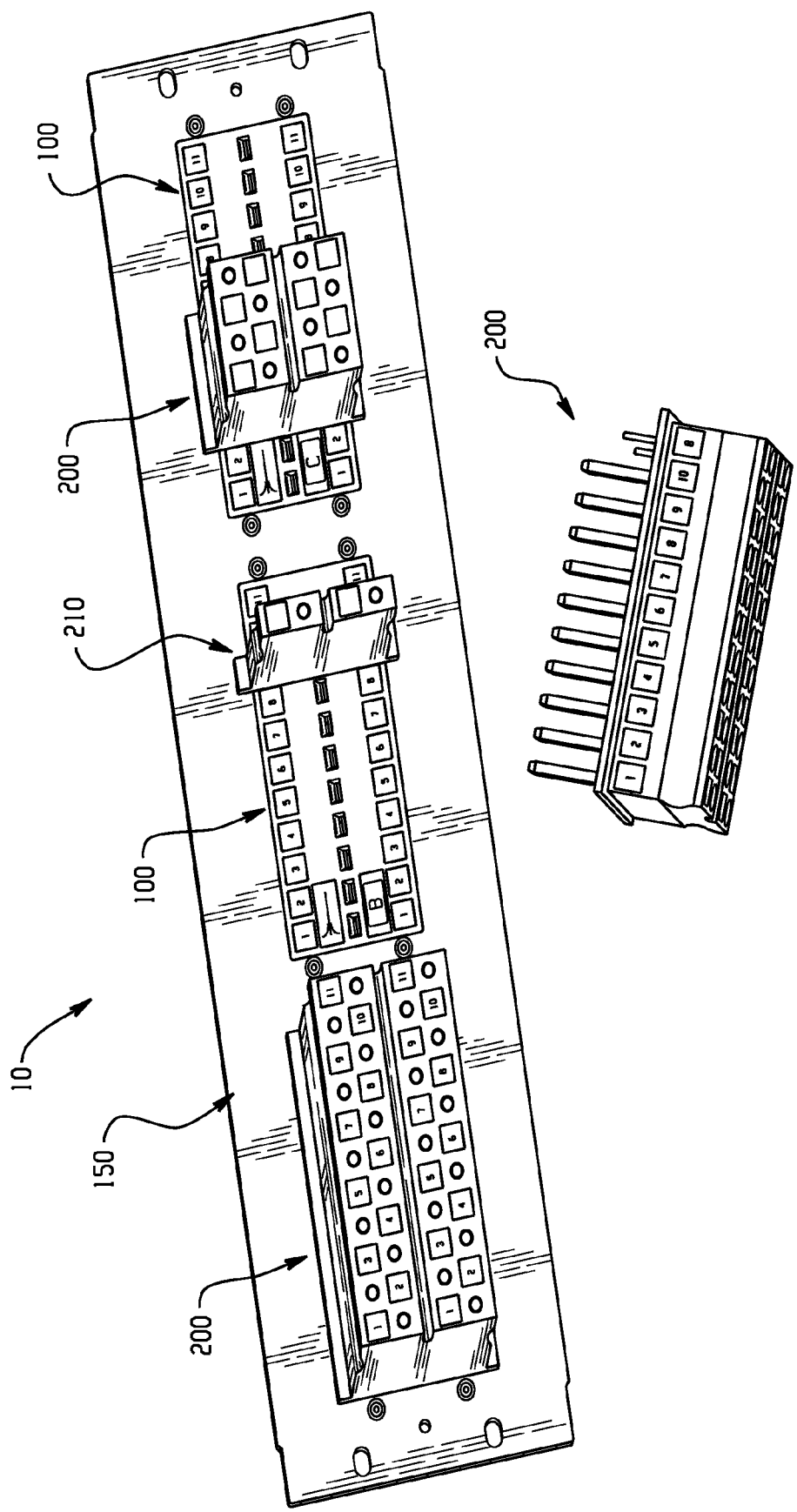
FIG. 11 illustrates the test block of FIG. 9 and a test plug according to a preferred embodiment of the present invention.
Figure 12:
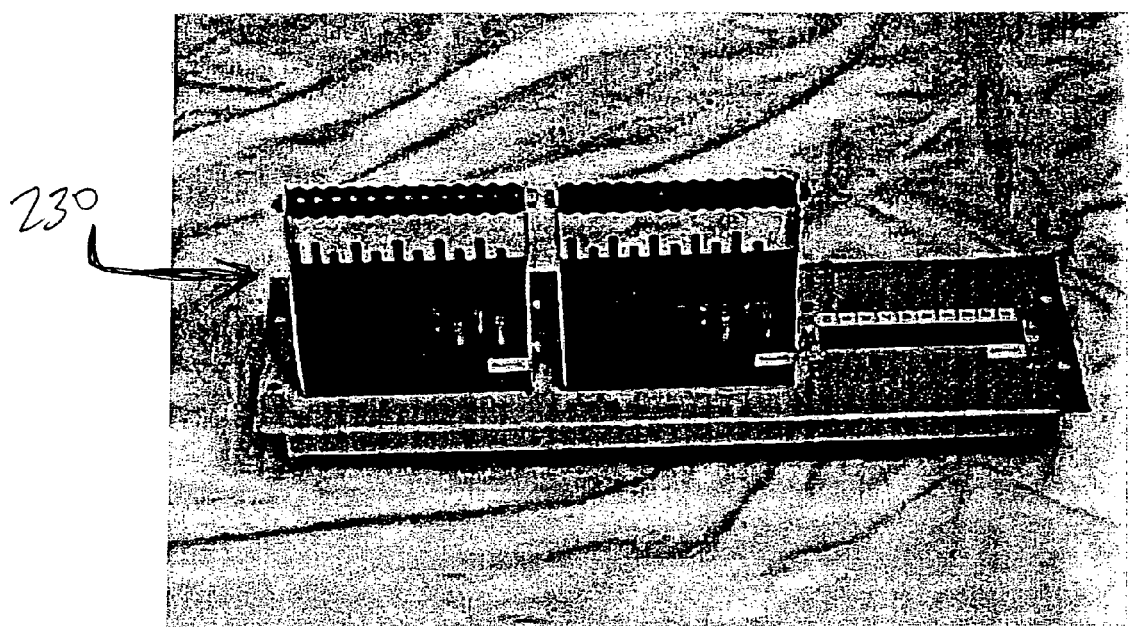
FIG. 12 illustrates another embodiment of a test plug in accordance with the present invention.
Figure 13:
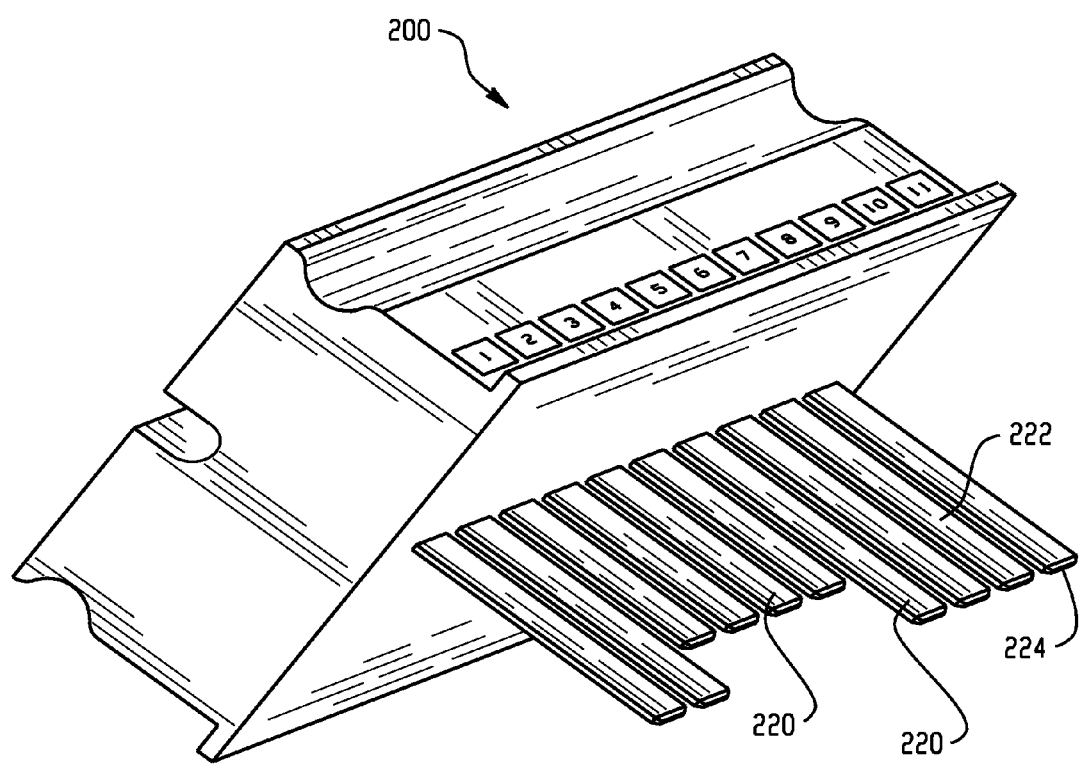
FIG. 13 illustrates a test plug showing an operating sequence step in accordance with one embodiment of the present system.

Referring now in detail to the drawing figures, wherein like reference numerals represent like parts throughout the several views, FIGS. 4*a-c* illustrate the functional principals of the present invention, and FIGS. 5-13 illustrate preferred embodiments of the present system 10 preferably comprising a test block 100 and a cooperative test plug 200. The test block 100 can be flush-mounted into an electrical panel or other devices connected to electrical circuits. The test block 100 mirrors circuits wired into the device, and enables these circuits to be tested and analyzed with testing equipment. The test plug 200 can be used for connection to any test set or testing equipment, and insertion into the test block 100.

The test block 100 preferably comprises a module 110, a spring assembly 120, a connector block 130, a coded disc 140, and a stabilizing assembly 150. The test block 100 preferably incorporates from two to twenty-one modules 110. As shown in FIG. 5, multiple test block modules 110 can form a test block 100.

The spring assembly 120 can comprise a first set 122 of springs and a second set 124 of springs. The modules 110 can be formed of plastic casings that hold the first set 122 of springs, in a preferred embodiment being two silver-coated copper springs, which springs touch at a touching point 126 during normal operation. The touching point 126 of the two silver-coated copper springs can be ensured by the second set 124 of springs, being two pressure springs that induce opposing pressures from both sides. The touching point 126 of the contact springs 122 can correspond with an aperture 128 for receiving a conductor to engage the touching point 126 of the contact springs 122.

The first set 122 of springs is preferably copper springs cut out of a special hardened copper sheet. After the cutting, the copper springs are bent on a first side to obtain a slight curvature and also a slight concavity. On a second side, a triangular bend is induced on the copper springs 122. This triangularly bent side is then inserted into the brass connector block 130, which allows for the attachment of a ring-lug cable connection 160 that preferably are suitable for #10AWG cable.

The special hardening of the copper coupled with the described bending enables the relatively soft material to avoid breaking under the pressure of repeated insertions of a test pin. All possibly conductive materials of the test block 100 are housed inside the plastic casing, thus achieving safety of touch.

In a preferred embodiment, the copper springs are provided in two discrete sizes, so that by a simple 180 degree turn of the brass connector, two types of mounting become available: surface mounting (screw movement from the top) and flush mounting (screw movement from behind).

For security coding purposes, one or more test block modules 110 can be used empty but equipped with coded discs 140 that only allow for a leading pin in a certain position to enter.

The assembly of a certain number of test block modules 110 can be stabilized with the stabilizing assembly 150. The stabilizing assembly 150 can comprise lacquered stainless steel side plates and two bolts going through the whole assembly and screwed to the side plates.

The contact openings (or apertures 128) of the test block modules 110 are preferably keyed for correct test plug pin insertion. For example, the apertures 128 can be keyed to only accept test pins (or fingers) having a certain predetermined pattern of ridges, a predetermined gauge, or any combination thereof.

The test plug 200 preferably comprises a test plug module 210, a test plug finger 220, and a housing assembly 230. The test plug 200 preferably incorporates from two to twenty-one modules 210. A module 210 of the test plug 200 can comprise a plastic casing with a cavity, from which protrudes the test plug finger 220, comprising a set of pins 222, preferably two flat brass pins, separated by an insulation layer 224. The insulation layer 224 can be an isolating sheet of plastic between the pins 222. This plastic sheet (or insulation layer 224) continues to the outward end of the brass pins 222, so that the tip is also made up of three layers.

In addition, the insulation layer 224 can be keyed as illustrated in FIGS. 7 and 8 to ensure proper connection and insertion into an appropriate block module aperture 128. For example, the keying can be accomplished by providing one or more coding ridges on the insulation layer 224 or varying the gauge of the test plug finger 220. It should be understood that this feature of the present invention can also be utilized in conjunction with other circuit interfaces.

Inside the plastic casings, each brass pin 222 continues to isolate contact points 226 for each pin 222. One contact 226 can either accommodate a banana plug inside the casing or (with an additional lug attached) can be used with double-isolated banana plugs. The other contact point 226 can be situated in the cavity of the plastic casing. These contacts 226 can be used to preset permanent short circuits by soldering the contacts 226 together. Alternatively, the contacts 226 can be coupled (or shorted) together using a shorting bridge 240 that can be inserted into a shorting aperture 228 located in the contacts 226. The shorting bridge preferably corresponds to the shorting aperture 228 so that the shorting bridge 240 adequately fits into the shorting aperture 228.

When the modules 210 of the test plug 200 are put in line with other modules 210, the cavity works to form a kind of alley, in which permanent cabling can be attached, and which can be covered by an isolating plastic cover during operation.

In a preferred embodiment, the pins 222 are provided in two discrete sizes, but can be provided at various lengths. For security coding purposes, one or more modules 210 can be used empty, but equipped with a leading pin that is longer than all other pins and flattened on one of eight sides. This leading pin is designed to only fit in a corresponding safety opening of the test block 100.

The complete plug 200 can be held together by the housing assembly 230, being two bolts, two side plates, and a plastic handle.

The present test plug 200 can have permanent or configurable shorting bridges 240. The test plug 200 can incorporate shorting bars between pre-assigned poles to short CT circuits, and keyed pins to prevent insertion into the wrong block openings. The shorting bars can be inserted into connection blocks in two or more test plugs 200 to couple the multiple test plugs 200. The shorting bars can have a variety of geographical dimensions and length. For example, the shorting bars can have a circular cross section. Preferably, the shorting bars are adapted to fit into connection holes (or apertures).

Connections at the test plug 200 are configurable using color coded, insulated banana connectors. Connections at the plug can be configured with a standard cable connection to the test instrument.

A keying system of the present invention eliminates matching mistakes common in conventional systems, assists in developing switch standards for particular relays, and provides a smooth and even connection. Each test plug module 210 of the present invention can be keyed by configuring the insulation 224 between pins 222. Each block module 110 can be cooperatively keyed, and should have matching openings 128 for proper insertion to occur. Keying can be accomplished by providing ridges on the insulation between the pins and on the openings on the test block. Keying may also be accomplished by varying the gauge of the test plug finger 220.

During normal operation, the test block 100 is integrated into an electrical panel, and all the circuits directed towards a relay or a meter pass one of the contacts of the test block 100. Due to the high quality of the silver-coated copper contact springs 122 and the tight fit provided by the pressure springs 124 of the test block 100, the test block 100 provides an internal resistance of no more than approximately two to approximately three milliohms, reaching no more than room temperature. Therefore, while it is not in use, the present invention has minimum impact on the electrical properties of the secondary circuit.

An automatic contact opening sequence takes place upon insertion of the test plug 200 into the test block 100. The contact opening sequence ensures proper isolation and restoration of the device being tested. All circuits revert back to an original state once the test plug 200 is removed from the test block 100.

When a pin of the test plug 200 is inserted into a V-shaped opening of the contact springs 122 of the test block 100, the two sides 222 of the pin 224 contact the respective sides of the contact springs 122 first, before forcing an opening of the contact point 126. Thus, a "make-before-break" sequence is achieved, which can be facilitated by flattened endings of the pins 222.

When the pin 222 is fully inserted, the two sides of the contact springs 122 are fully separated and the circuit is opened and current flow is redirected via the respective sides of the pin 222. The relay, meter, or circuit is now ready for testing. That is, for example, the current can be injected on the one side of the test plug 200 and the reaction of the meter or relay can be measured on the other side.

The different lengths of pins 222 can enable time-phase opening of circuits. CTs and PTs can be eliminated before signal circuits are opened. Provisions for short-circuiting in the test plug preferably eliminate all risk of having open CTs or PTs after insertion. The pattern of short circuits and short/long pins 222 can be defined through the leading pins 222 of the test plug 200, which are adjusted to the corresponding discs in the test block 100 that has been designated to be used with a special test plug 200.

Both the individual way of cooperatively working of one block module 100 to one plug module 210, and the complex interaction of an assembled test block 100 and corresponding test plug 200, offer a novel and non-obvious way of opening circuits that goes beyond the testing of meters and relays. The principle can be used in many electrical situations where the opening of circuits during operation is required.

FIGS. 4*a-c* illustrate functional principals of the present invention. The present system 10 is easy and reliable to handle. In FIG. 4*a*, the test block 100 is shown without the test plug 200 connected and current flows unimpeded through the test block 100.

When the test plug 200 touches the contacts of the test block 100, as shown in FIG. 4*b*, the current flows back over the low resistant contacts and shorting bridge 240, wherein the relay is still connected.

When the test plug 200 is fully inserted into the test block 100, as shown in FIG. 4*c*, the current flows back over the low resistant contacts 222 and shorting bridge 240, wherein the relay can be tested with the test equipment current.

As shown in FIGS. 4*a-c*, the present system 10 maintains correct circuit polarity over the full travel of the test plug 200. The test plug electrical circuit is made before the test block, contact pair breaks. In this way, a dead band does not exist during circuit transition. For a CT circuit the shorting bridge 240 is installed in the plug side between two adjacent poles. In FIGS. 4a-c, the shorting bridge 240 is perpendicular to the plane of the page.

The present system 10 places engineered test characteristics in the test plug 200 (not the test block 100). This change simplifies the test block 100 (lower cost and complexity), and makes test characteristics not only portable, but easily upgraded at minimum cost. When the test plug finger 220 is inserted into the test block module, the contact pair 222 is switched open in a "make-before-break" sequence. As a result, the connected circuit is redirected through the test plug 200. Two adjacent test block modules 210 can be used to form a current transformer circuit by coupling the adjacent test block modules with a shorting bar 240.

The shorting bridge 240 can be installed in the test plug 200 between corresponding test modules 210. The test plug 200 can be keyed to verify circuit and pole orientation. When the test plug 200 is inserted the current transformer circuit is redirected through the shorting bridge 240. The current input to the relay is isolated and available for connection to an external test instrument. Test plug finger 220 length determines the sequence that test block module pairs are opened as the test plug is inserted into or removed from the test block 100. An automatic operating sequence with up to four steps is preferable, and other such sequences are possible by utilizing test plug (or pins) having various lengths.

The present system permits a test engineer to re-examine the problem and to therefore re-think the solution. In essence, the present system 10 builds upon a test block that is a simple, reliable termination module with an internal contact pair. One can replicate the test block numerous times by reconfiguring the test plug 210. For example, by changing the configuration of the test plug of the present system 10 a circuit to be tested can be altered. The test plug 210 is a sophisticated test device that can be configured and re-configured for many different testing procedures.

FIGS. 8-12 show embodiments of the present test block, one comprising a 19-inch rack assembly, 30 poles (3 groups), and embodiments of the present test plug.

Additional advantages of the present invention over the prior art earlier discussed follows.

Conductor Termination

Both ABB and the present system 10 provide terminations suitable for #10AWG ring connectors. ABB test block contains screw, or stud terminals for conductor termination.

The present system 10 offers optional screw, stud, and IEC style terminations at the test block 200. AREVA is configured only with IEC style terminations.

Operating Sequence

Figure 14:
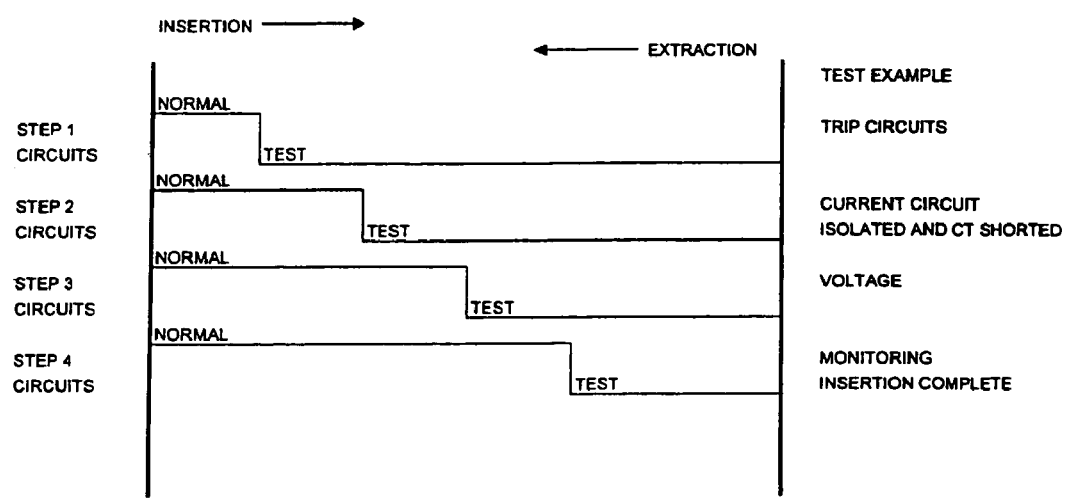
FIG. 14 illustrates an automatic operating sequence using a multifinger test plug in accordance with a preferred embodiment of the present invention.

The AREVA test block is available with a three stage, automatic operating sequence. The present system 10 offers a test plug 210 configuration with automatic operating sequence in preferably four steps. By varying the lengths of the fingers (or pins) of the test plug 210, different circuits can be energized before others providing an initialization sequence. Selected circuits are switched before others steps as the test plug 210 is inserted into the test block 200. When the test plug 210 is withdrawn from the test block 200, the circuits are restored in reverse order beginning with the last step. FIG. 14 illustrates how critical circuits may be automatically operated in sequence by varying the length of test plug fingers 220.

Upon insertion of the plug, the present invention performs a four step automatic operating sequence. When the test plug is inserted, the trip circuits are first opened by the longer pins, followed by the shorter pins that automatically short the CT circuits via the shorting bridge. Voltage circuits are then redirected through the plug and test procedures are ready to begin. When the plug is withdrawn, the circuits are restored in reverse order, beginning with step four of the insertion sequence. This automatic operating sequence simplifies the job of the technician. Proper isolation and restoration of the device being tested is achieved every time. Costly false trips and errors in CT short-circuiting are no longer a concern with the present invention.

Automatic operation avoids costly error. For example, consider the restoration of a distance relay after test. Typically, the voltage constraints would be restored before the current and trip circuits. Recently, a great lakes region utility lost a 345 kV line that was tripped accidentally. Investigation revealed that a backup distance relay caused the trip while being placed back in service. The experienced technician simply flipped a test block switch out of sequence and in error. A test block and plug configured with an automatic operating sequence would have prevented this costly outage.

Electrical Ratings and Applicable Standards

TABLE 3 compares published information obtained from manufacturer's data sheets. Listed current ratings: ABB FT-1 Switch is rated 30 amps (Descriptive Bulletin 41-077.)

TABLE 3

| DESCRIPTION | ABB | ALSTOM | SECUCONTROL |
|---|---|---|---|
| SWITCHING OPERATION | Knife Blade Individual | Contact Pair Plug Insertion | Contact Pair Plug Insertion |
| LOCATION | Base | Cassette | Module |
| POLES, MIN | 1 | 1 | 1 |
| POLES, MAX | 10 | 14 | 21 |
| CONDUCTOR | N/A | N/A | Silver Plated Copper and Brass |
| POLE RATING | 30 A Per C37.90 600 V | 20 A, Continuous, 500 A For 1 Second 600 V AC RMS 4 kV PEAK FAST TRANSIENT 2.5 kV PEAK OSCILLATORY PER IEEE C37.90.1 | 30 A, Continuous, 500 A For 1 Second 600 V DC 4 kV PEAK FAST TRANSIENT 2.5 kV PEAK OSCILLATORY PER IEEE C37.90.1 |
| ANSI/IEEE | C37.90 | C37.90.1 | C37.90.1 |
| UL | RECOGNIZED | | |
| | | IEC, CE | IEC, CE |
| REFERENCE | ABB 41-077 | P990/EN BR/Cc | SECUCONTROL |

The AREVA P990 Series Test Block and Plug (noted as ALSTOM) is rated 20 amps continuous, 500 amps for one second (Publication: P990/EN BR/C.) The present system (noted as Secucontrol) is rated 20 amps continuous, and 500 amps for one second.

In relay applications, test blocks, plugs, and probes must comply with the ANSI/IEEE Standard C37.90-1989, IEEE Standard for Relays and Relay Systems Associated with Electrical Power Apparatus. Other related standards cover surge withstand (C37.90.1-2002,) electromagnetic interference (C37.90.2-1995,) and electrostatic discharge (C37.90.3-2001.) Applicable IEC electrical standards include high voltage impulse (60255-5: 2000,) dielectric withstand (60255-5: 2000,) electrostatic discharge (60255-22-2: 1966.) Other IEC standards cover mechanical issues: vibration (60255-21-1: 1998,) shock (60255-21-2: 1998,) seismic (60255-21-3: 1993,) and enclosure (60529: 1989.)

Electrical Resistance

The electrical materials used in the construction of the test blocks vary by manufacture. The ABB test block materials are not described in publications. However, the electrical switch contacts, knife-blade, and hinge pin will attract a magnet; suggesting the parts are plated-steel. AREVA switch circuit, materials are not published; burden is listed at less than or equal to 10 milliohms. The present system contains electrical circuits constructed with silver-plated, copper and brass (rated 20 amps continuous, and 500 amps for one second.) In revenue metering and protective relay application, the electrical resistance of the test block is a concern because the device adds to the resistance of the circuit. From actual measurements, it is observed that the ABB FT-1 Switch introduces a circuit resistance that is between 5 and 25 times larger than either AREVA or the present system.

Figure 15:
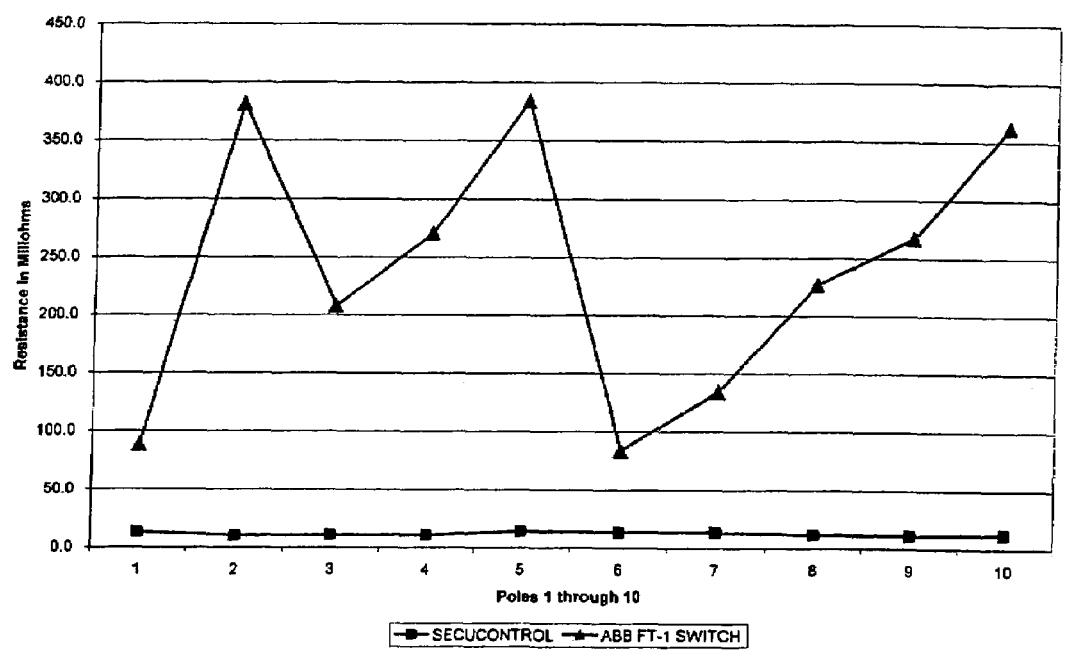
FIG. 15 is a graph of the introduction of circuit resistance as between an embodiment of the present invention and a prior art design.

FIG. 15 lists resistance data for comparison. An ABB FT-1 Switch with 10 poles is compared with a 10 pole, modular test block of the present system 10. In the test setup, the voltage drop across each pole is measured with a 5 ampere DC current. The resistance is calculated using Ohm's law.

Current Transformer Burden

Test block circuit resistance impacts more than voltage drop and watt loss. In a protective relay application it is important to keep the burden placed on the current transformer within acceptable limits. At currents near CT core saturation, an increase in CT burden results in an increase in CT error. This error is the result of an increase in current waveform distortion that occurs with operation at or above the knee-point voltage of the typical excitation voltage curve. The distorted current is interpreted by the relay as lower (below the set point) than the current level expected with an undistorted waveform. Protective margins between prime and backup relays would reduce and/or may overlap. Another concern is that distorted current is interpreted differently by digital relays (software algorithms) not of the same manufacturer.

A method for calculating the expected CT burden is found in the technical reference: IEEE Guide for Application of Current Transformers Used for Protective Relaying Purposes, IEEE C37.110-1996. Consider the example summarized by FIG. 16. In this example, the current transformer burden is calculated for a Class C, Multi-Ratio, 1200/5 CT ratio, secondary winding resistance=0.61 ohm. The current transformer is connected by 2×850 feet of #10AWG copper conductor (1 ohm per 1000 feet.) This circuit is evaluated for comparison of the effect introduced by the resistance of each test block. In the calculations, two relay burdens are considered: an electromechanical relay (0.051 ohms,) or a digital relay (zero ohms). Current transformers used for protective relay applications are typically IEEE Class C. By IEEE definition, Class C means that the ratio error will not exceed 10 percent for any current up to 20 times rated current with a standard burden of 1 ohm. In the calculation, burden is evaluated at 20 times rated current with an error limit of 10 percent in accordance with the IEEE method.

It is concluded from this calculation that the current transformer burden would be within acceptable IEEE limits when using either the present system 10 or the AREVA test block. However, in this example the current transformer burden calculated using an ABB FT-19 would exceed acceptable IEEE limits.

Applications of the present invention include metering and protective relays. Applications in and outside of the electric power industry continue to grow.

The present invention provides numerous beneficial features. It provides an increase in safety over conventional systems, for example, as use of the invention eliminates the need to open and close contacts by hand, ensures that test block and test plug match with a keying system, provides the automatic short-circuiting of CT circuits, and guarantees finger safety by limiting exposed metals.

The present invention provides an increase in test efficiency over conventional systems, for example, as it reduces setup time by pre-wiring plug to test set, establishes testing routines for similar relays, and plug and play functionality provided once connected to test set.

The present invention saves panel space over conventional systems, for example, as its open and connect functionality reduces pole count by 50%, it can eliminate unused contacts with its modular design, and it reduces wiring by mounting the test block next to the relay.

The present invention can save money over using conventional systems, for example, as one need order only the required number of modules, and one plug can be used with multiple blocks.

While the invention has been disclosed in its preferred forms, it will be apparent to those skilled in the art that many modifications, additions, and deletions can be made therein without departing from the spirit and scope of the invention and its equivalents as set forth in the following claims.

I claim:

1. A high to medium voltage interface test device for testing a high to medium voltage circuit, the interface test device comprising:
   a block module having a first aperture, the block module being electrically connected with and in line with the circuit; and
   a plug module having a finger insertable into the first aperture so that the finger opens and connects to the circuit substantially simultaneously such that a portion of the circuit is isolated from the circuit, the plug module configured to receive a test probe to provide test inputs to the isolated portion of the circuit and a meter probe to meter at least a portion of the circuit.

2. The device of claim 1, the finger comprising isolated conductors to maintain correct polarity for the circuit upon insertion into the first aperture, the isolated conductors being isolated by an electrical insulator disposed between the conductors, the conductors being disposed on the side of the electrical insulator and having a length less than the electrical insulator.

3. The device of claim 1, the block module comprising a pair of contacts to form a contact point to receive the finger such that one contact is coupled to one conductor of the plug module and the other contact is coupled to another conductor of the plug module, the isolated conductors forming a portion of the same electrical path as the pair of contacts upon insertion into the first aperture by virtue of contact with the pair of contacts of the finger.

4. The device of claim 3, the block module comprising a pair of biasing members to bias the pair of contacts, the biasing members located on either side of the pair of contacts and extending toward the contacts in a substantially orthogonal alignment and being coupled to a corresponding interior side of the block module.

5. The device of claim 4, wherein the contacts are contact springs and the biasing members are biasing springs, the biasing springs providing bias pressure on opposing sides of the contact springs proximate the contact point, and wherein at least a portion of the contact springs are hardened.

6. The device of claim 1, the plug module comprising a second aperture to receive the test probe, the second aperture being coupled to at least a part of the finger and defined on an exterior surface of the plug module.

7. The device of claim 1, the finger comprising a coding ridge having a ridge pattern disposed along at least a portion of the length of the electrical insulator, and the first aperture comprising an interior portion having a keyed section corresponding to the ridge pattern such that the finger is keyed to the first aperture to ensure proper insertion into the first aperture.

8. The device of claim 1, the block module having a resistance of approximately two milliohms to approximately three milliohms.

9. An interface test system for use in testing a plurality of medium to high voltage circuits, the interface test system comprising:
a test block having a plurality of connection points and a set of apertures corresponding to the connection points, the plurality of connection points configured for electrical connections to a unique corresponding circuit, the apertures being disposed in a serial row and each containing an interior keyed section; and
a test plug having a plurality of fingers corresponding to and insertable into the apertures to contact the connection points, wherein the fingers substantially simultaneously open and connect to the unique corresponding circuits, the fingers each comprising a keyed section along the length of the fingers, the keyed finger sections corresponding to the interior keyed sections of the apertures.

10. The system of claim 9, the test block further comprising a first set of springs to form the connection points, and a second set of springs to bias the first set of springs, the first set of springs each comprising hardened sections to strengthen the first set of springs, the second set of springs being coil springs that contact the first set of springs in a substantially orthogonal alignment.

11. The system of claim 9, wherein at least one finger of the plurality of fingers comprises a pair of conductors separated by an insulator to maintain correct polarity for at least one circuit upon inserting the at least one finger into one of the apertures.

12. The system of claim 9, wherein at least two of the fingers of the test plug have different lengths to engage at least two of the connection points at different times such that the fingers engage the connection points and open corresponding unique circuits in a time-phased manner.

13. The system of claim 9, the test plug further comprising a leading pin and the test block further comprising a safety aperture to receive the leading pin.

14. The system of claim 9, the test plug further comprising a plurality of plug modules coupled together to short at least two circuits.

15. The system of claim 9, wherein at least one of the fingers and at least one of the apertures is keyed with a first key pattern ridge to ensure proper insertion between the at least one finger and the at least one aperture and to prevent another finger having a second key pattern ridge from being inserted into an aperture having the first key pattern ridge.

16. The system of claim 9, wherein the test block has a resistance of approximately two milliohms to approximately three milliohms.

17. An interface testing method for a high to medium voltage circuit, the method comprising:
inserting a finger of a test module into a first aperture of a block module, the first aperture being connected to the circuit, the test module comprising a test probe input to provide test inputs and a meter probe input;
opening the circuit with the finger;
connecting the finger to the circuit;
wherein opening and connecting to the circuit occur substantially simultaneously such that a portion of the circuit is isolated;
providing test inputs to the isolated portion of the circuit via the test probe input and metering the unisolated portion of the circuit via the meter probe input.

18. The method of claim 17 further comprising:
providing the finger with a first conductor isolated from a second conductor;
providing a contact point defined by a first and second contact spring;
coupling the first conductor to the first contact spring; and
coupling the second conductor to the second contact spring, and
wherein the isolated conductors forming a portion of the same electrical path as the pair of contacts upon insertion into the first aperture by virtue of contact with the pair of contacts of the finger.

19. The method of claim 17, further comprising connecting a second finger into a second circuit before connecting the first finger into the first circuit.

20. The method of claim 17, further comprising keying the finger to correspond with an aperture for receiving the finger, wherein keying comprises providing a keyed pattern on a ridge of the finger and providing a corresponding keyed section within the first aperture to prevent a non-corresponding key pattern from entry into the aperture.

* * * * *